US010068978B2

(12) United States Patent
Lim et al.

(10) Patent No.: US 10,068,978 B2
(45) Date of Patent: Sep. 4, 2018

(54) METHODS, APPARATUS AND SYSTEM FOR PROVIDING SOURCE-DRAIN EPITAXY LAYER WITH LATERAL OVER-GROWTH SUPPRESSION

(71) Applicant: GLOBALFOUNDRIES INC., Grand Cayman (KY)

(72) Inventors: Kwan-Yong Lim, Niskayuna, KY (US); Christopher Michael Prindle, Poughkeppsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/472,924

(22) Filed: Mar. 29, 2017

(65) Prior Publication Data

US 2017/0200797 A1 Jul. 13, 2017

Related U.S. Application Data

(62) Division of application No. 14/656,412, filed on Mar. 12, 2015, now Pat. No. 9,640,533.

(51) Int. Cl.
*H01L 29/06* (2006.01)
*H01L 29/417* (2006.01)
(Continued)

(52) U.S. Cl.
CPC .... *H01L 29/41791* (2013.01); *G06F 17/5072* (2013.01); *H01L 21/823418* (2013.01);
(Continued)

(58) Field of Classification Search
CPC ............... H01L 29/41791; H01L 29/45; H01L 29/66553; H01L 29/0688; H01L 29/0649;
(Continued)

(56) References Cited

U.S. PATENT DOCUMENTS

| 2015/0144998 A1* | 5/2015 | Ching | H01L 21/823431 257/190 |
| 2016/0163837 A1* | 6/2016 | Wu | H01L 29/66795 438/283 |

* cited by examiner

*Primary Examiner* — Cuong B Nguyen
*Assistant Examiner* — Samuel Park
(74) *Attorney, Agent, or Firm* — Williams Morgan, P.C.

(57) ABSTRACT

At least one method, apparatus and system disclosed herein for suppressing over-growth of epitaxial layer formed on fins of fin field effect transistor (finFET) to prevent shorts between fins of separate finFET devices. A set of fins of a first transistor is formed. The set of fins comprises a first outer fin, an inner fin, and a second outer fin. An oxide deposition process is performed for depositing an oxide material upon the set of fins. A first recess process is performed for removing a portion of oxide material. This leaves a portion of the oxide material remaining on the inside walls of the first and second outer fins. A spacer nitride deposition process is performed. A spacer nitride removal process is performed, leaving spacer nitride material at the outer walls of the first and second outer fins. A second recess process is performed for removing the oxide material from the inside walls of the first and second outer fins. An epitaxial layer deposition processed upon the set of fins. A portion of the lateral over-growth of epitaxial layer on the outer walls of the first and second outer fins is suppressed by the spacer nitride material.

6 Claims, 12 Drawing Sheets

(51) Int. Cl.
*H01L 27/088* (2006.01)
*H01L 21/8234* (2006.01)
*H01L 29/66* (2006.01)
*G06F 17/50* (2006.01)
*H01L 29/45* (2006.01)
*H01L 29/78* (2006.01)
*H01L 29/165* (2006.01)

(52) U.S. Cl.
CPC .. *H01L 21/823431* (2013.01); *H01L 27/0886* (2013.01); *H01L 29/0649* (2013.01); *H01L 29/0688* (2013.01); *H01L 29/45* (2013.01); *H01L 29/6653* (2013.01); *H01L 29/66553* (2013.01); *H01L 29/66795* (2013.01); *H01L 29/785* (2013.01); *H01L 29/165* (2013.01)

(58) Field of Classification Search
CPC ............ H01L 29/785; H01L 29/66795; H01L 29/6653; H01L 27/0886; H01L 21/823431; H01L 21/823418; H01L 29/165; G06F 17/5072
See application file for complete search history.

METHODS, APPARATUS AND SYSTEM FOR PROVIDING SOURCE-DRAIN EPITAXY LAYER WITH LATERAL OVER-GROWTH SUPPRESSION

BACKGROUND OF RELATED APPLICATIONS

This application is a divisional of co-pending U.S. patent application Ser. No. 14/656,412, filed Mar. 12, 2015.

BACKGROUND OF THE INVENTION

Field of the Invention

Generally, the present disclosure relates to the manufacture of sophisticated semiconductor devices, and, more specifically, to various methods for fabricating high performance finFET devices using epitaxial layer with overgrowth suppression.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled TO determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. FinFETs generally have the increased channel widths, which includes channel portions formed on the sidewalls and top portions of the fins. Since drive currents of the finFETs are proportional to the channel widths, finFETs generally display increase drive current capabilities.

Typically, in order to increase performance capability of devices, designers had proposed increasing the height of the fins in state of the art finFETs. Increasing the height of the fins would increases would increase the current drive of the finFET, thereby increasing performance of the finFETs. However, the greater height would cause the device to be larger in size, leading to larger sized integrated circuit made from the finFETs.

Another state of the art solution offered by designers includes growing an epitaxial (EPI) layer at the top of source/drain fins of finFETs. FIG. 2 illustrates a stylized depiction of a cross-sectional view of a typical growth of EIP layer at the top of source/drain fins of a typical finFET. A plurality of fins 220a, 220b, 220c are formed in a shallow trench isolation (STI) layer 210 for manufacturing finFETs 200.

To increase the current drive of the finFETs 200, the source-drain fins 220, epitaxial (EPI) layers 230 are formed on the fins 220. One problem associated with the state of the art includes the fact that as the EIP layers 230 are formed on the fins 220, lateral growth may cause a short to occur between fins 210b and 210c, which are fins of different finFET devices. Although the connection of the EPI layer 230 between fins 220a and 220b are not problematic since they belong to the same device, the short between the EPI layer between the fins 220b and 220c are problematic since they are respectively of different devices. Therefore, this process is not possible in many designs, such as designs that contain tight chip design rules and densely arranged devices and/or fins. Some designers have attempted to suppress lateral EPI growth to address this problem. However, this approach limits the EPI layers in such a manner that high leakage currents may be induced because contact silicide can be formed too close to the channel.

FIG. 3 illustrates a stylized depiction of a top view layout of a typical finFET device. FIG. 3 illustrates two gate regions 310a, 310b of a finFET device 300. FIG. 3 shows source-drain fins 320. EPI growth 330 may be formed at the top of the fins 320 to enhance current drive. However, as shown in the portion above the gate 310b, a source-drain bridge 350 may occur due to the over-growth of the EPI layer 330, causing a short upon the end of the gate 310b. This short may cause various errors and operational problems.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for suppressing over-growth of epitaxial layer formed on fins of fin field effect transistor (finFET) to prevent shorts between fins of separate finFET devices. A set of fins of a first transistor is formed. The set of fins comprises a first outer fin, an inner fin, and a second outer fin. An oxide deposition process is performed for depositing an oxide material upon the set of fins. A first recess process is performed for removing a portion of oxide material. This leaves a portion of the oxide material remaining on the inside walls of the first and second outer fins. A spacer nitride deposition process is performed. A spacer nitride removal process is performed, leaving spacer nitride material at the outer walls of the first and second outer fins. A second recess process is performed for removing the oxide material from the inside walls of the first and second outer fins. An epitaxial layer deposition processed upon the set of fins. A portion of the lateral over-growth of epitaxial layer on the outer walls of the first and second outer fins is suppressed by the spacer nitride material.

BRIEF DESCRIPTION OF THE DRAWINGS

The disclosure may be understood by reference to the following description taken in conjunction with the accompanying drawings, in which like reference numerals identify like elements, and in which.

Figure 1:
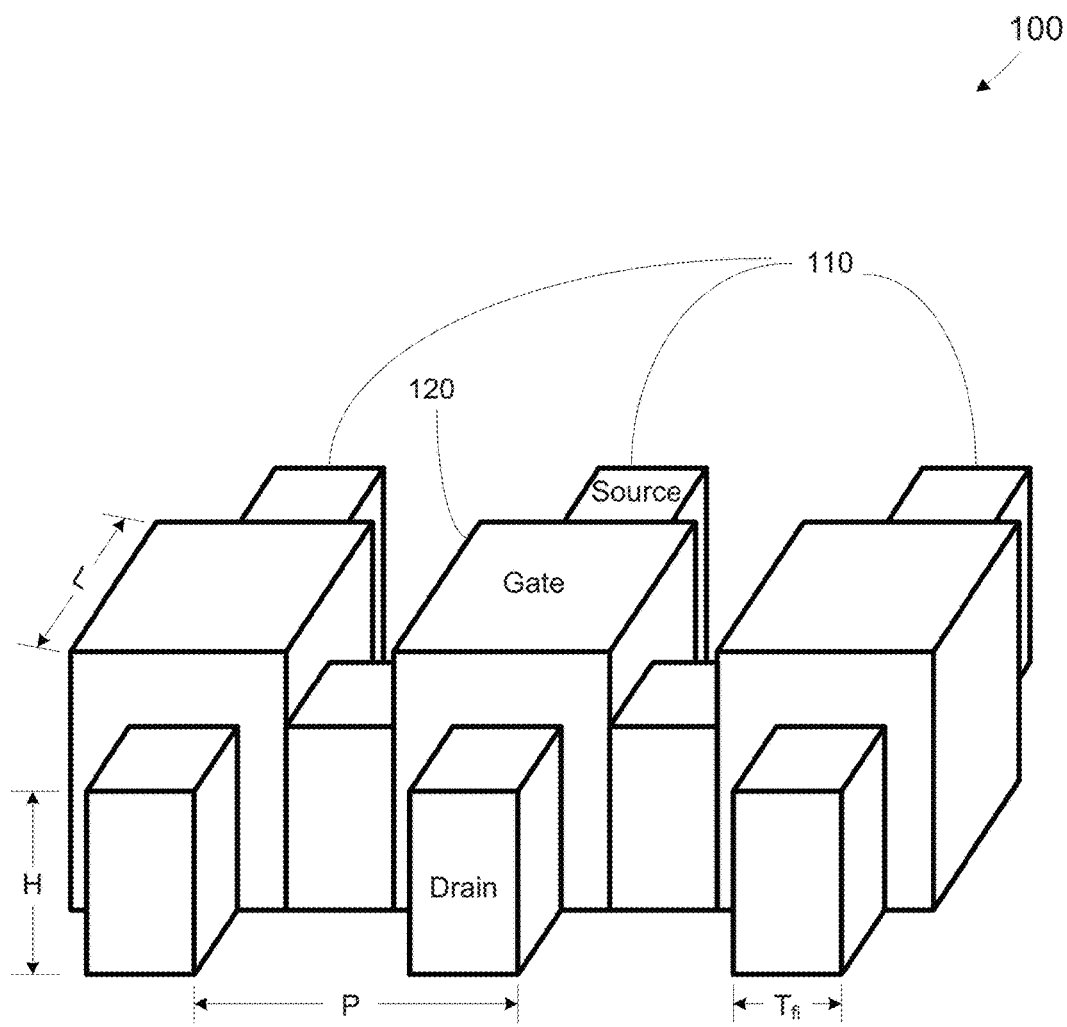
FIG. 1 illustrates a stylized cross-sectional depiction of a state-of-the-art FinFET device.
Figure 2:
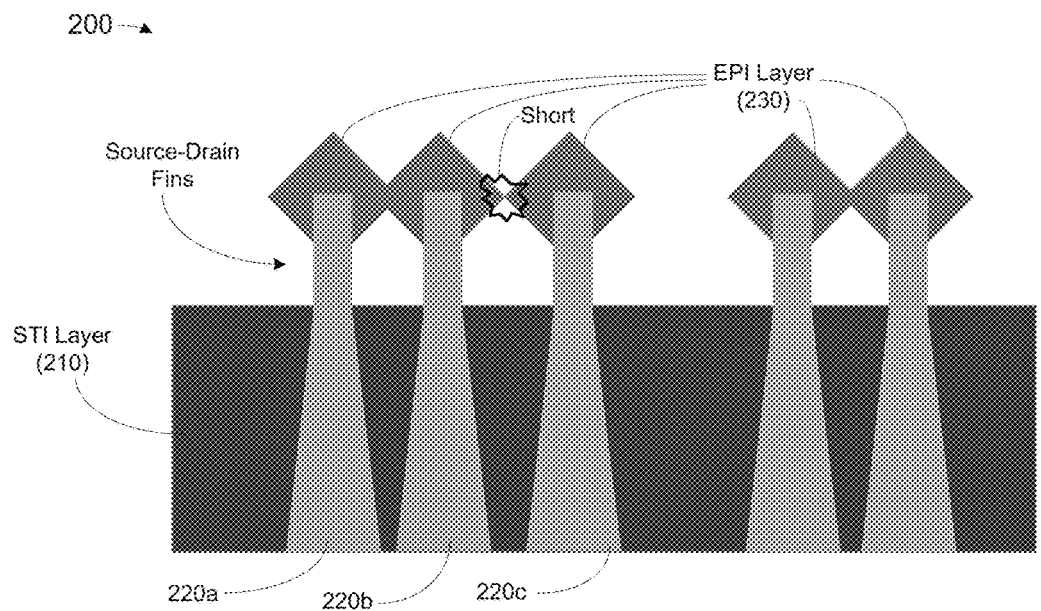
FIG. 2 illustrates a stylized depiction of a cross-sectional view of a typical growth of EIP layer at the top of source/drain fins of a typical finFET.
Figure 3:
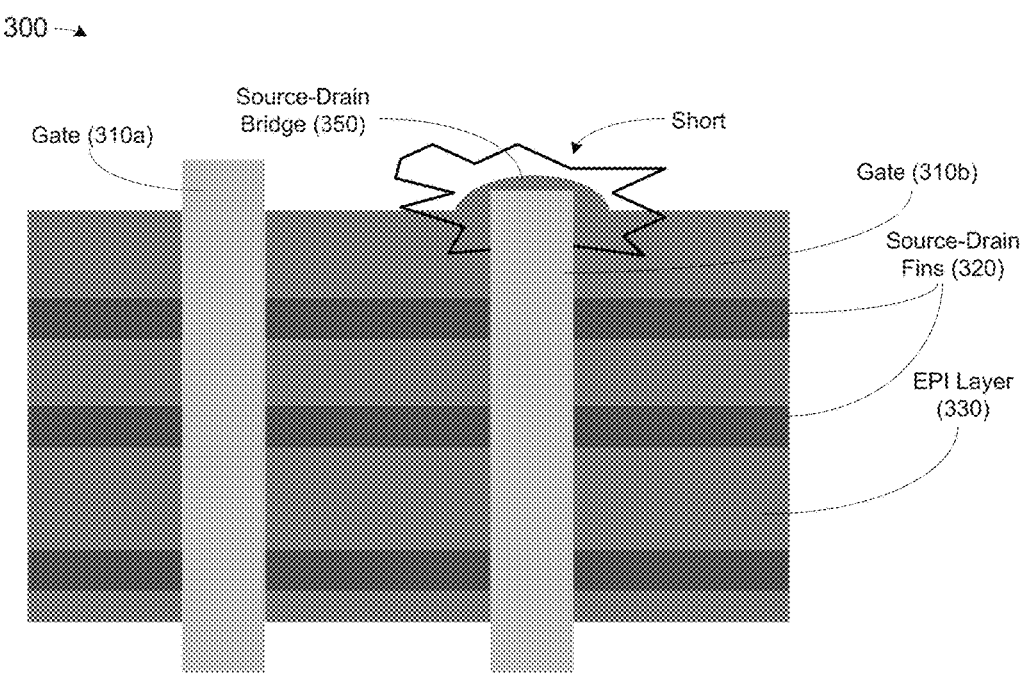
FIG. 3 illustrates a stylized depiction of a top view layout of a typical finFET device herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for increasing at least a portion of one or more source or drain fins of finFET devices using epitaxial (EPI) deposition/growth. Embodiments herein provide for increasing the current drive of a finFET by controlling the deposition of an EPI layer, e.g., single-domain (SD) EPI layer, on the top regions of source-drain fins of a finFET. Embodiments herein provide for controlling the lateral growth of EPI layer on source-drain fins substantially without impeding the vertical growth of EIP layer. In this manner, shorts caused by over-growth of EPI layers on densely formed fins are reduced, while maintaining sufficient EPI growth.

Figure 4:
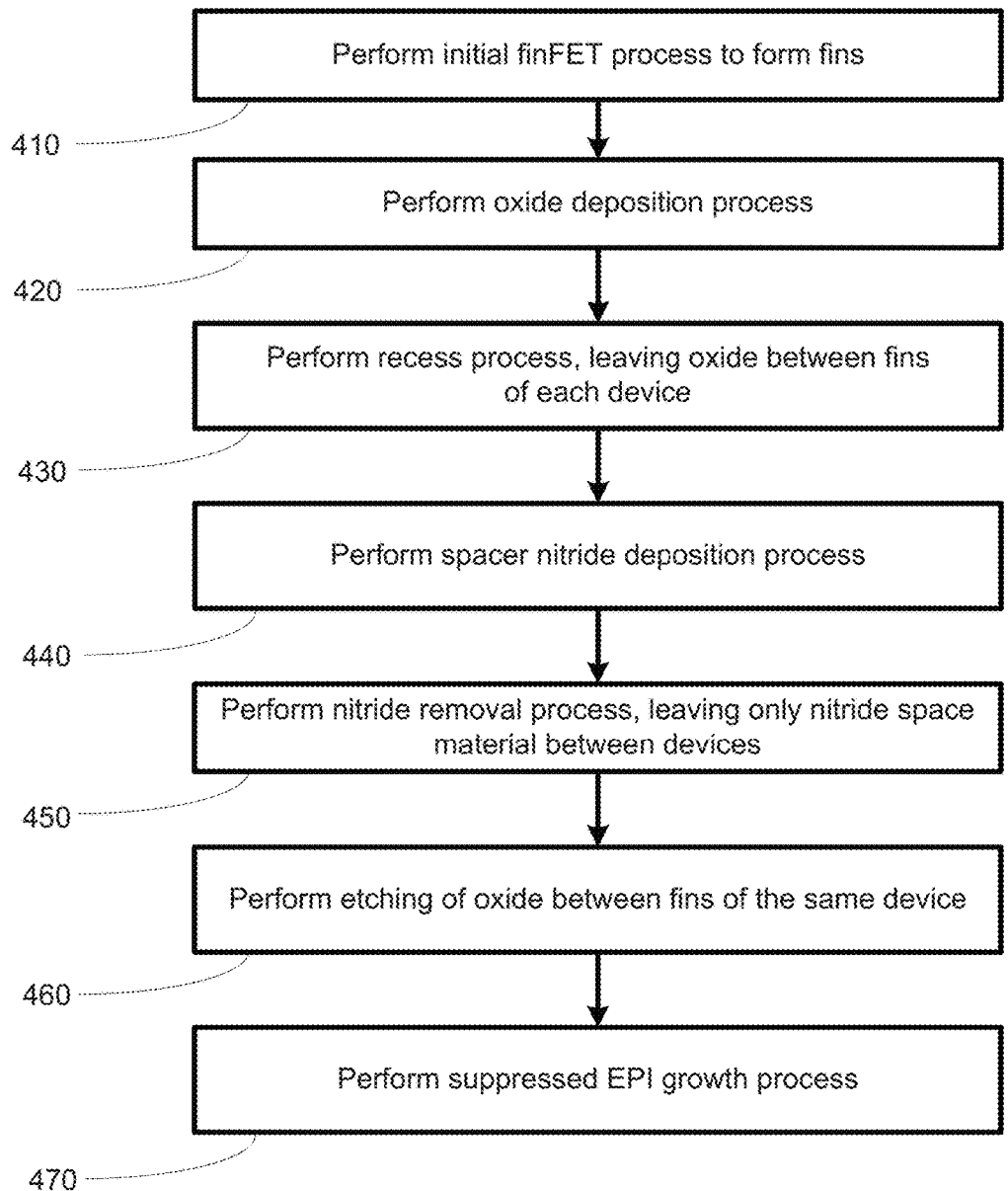
FIG. 4 a flowchart depiction of a method for forming EPI layer on source-drain fins for finFET devices while controlling later over-growth, in accordance with embodiments herein.

Turning now to FIG. 4, a flowchart depiction of a method for forming EPI layer on source-drain fins for finFET devices while controlling lateral over-growth, in accordance with embodiments herein, is illustrated. A semiconductor wafer processing system may perform an initial finFET processing protocol for forming source/drain fins (block 410). An oxide deposition process may then be performed (block 420). This process may comprise deposition of silicon oxide over the fins. In many embodiments, the fins are formed in a dense manner, wherein the small spaces between the densely formed fins are filled by oxide deposition.

Subsequently, a recess process to remove the silicon oxide is performed (block 430). The recess process may comprise implementing a wet etch process, a SiCoNi etch process, or a combination of both, which results in substantial removal of silicon oxide layer. This process results in removal of the silicon oxide from the fins while leaving silicon oxide material between the fins of a single finFET device, i.e., between the narrow gap of fins of each finFET device.

A spacer nitride deposition process may then be performed (block 440). The spacer nitride deposition process comprises depositing silicon nitride over the source-drain fins of the finFET. A nitride removal process may then be performed (block 450). This process leave nitride spacer material (e.g., silicon nitride) between the devices, i.e., on the outer walls for the fins of each finFET.

Subsequently, an etching process for removing the remaining silicon oxide between the fins may be performed (block 460). This process leaves the exposed part of the fins (i.e., the portion of the fins above the STI layer) substantially bare except for the silicon nitride remaining on the outer walls of the outer fins of each finFET.

At this point, an EPI deposition process is performed (block 470), which results in growth of the EPI layer in a laterally suppressed manner, as described in further details below. That is, the remaining silicon nitride materials on the outer fin wall suppress the lateral and/or partial downward vertical growth of the EPI layers on the outer portions of the outer walls of the source-drain fins. Accordingly, EPI growth at the top of the source-drain fins are controlled by embodiments herein, wherein lateral growth of the outer fins are limited as to prevent shorts to fins or to other features of adjacent finFET devices.

Figure 5:
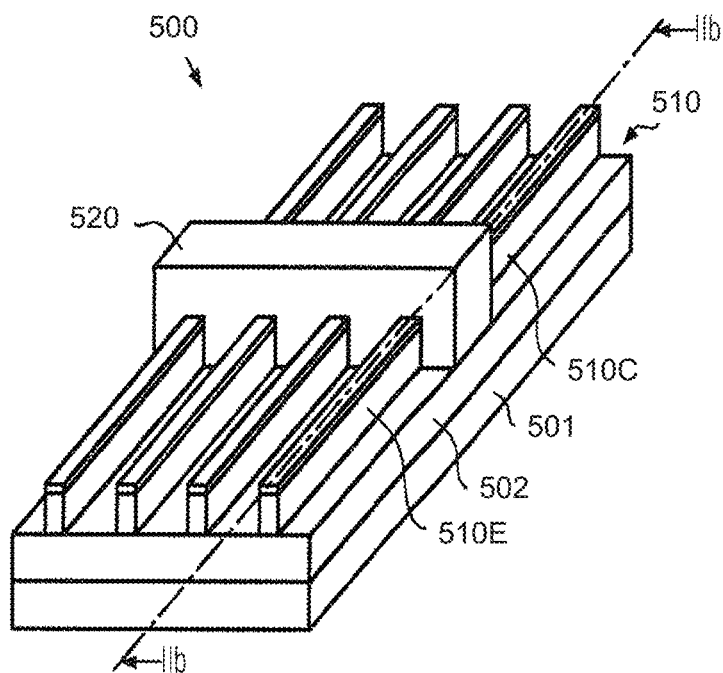
FIG. 5-6 illustrates various stylized diagrams relating to forming a finFET device, in accordance with embodiments herein.
Figure 6:
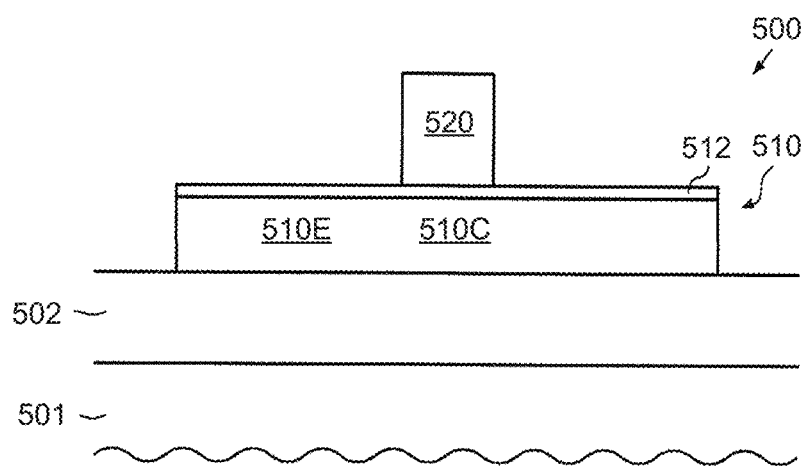

FIGS. 5-6 illustrate various stylized diagrams relating to forming a finFET device, in accordance with embodiments herein. FIG. 5 schematically illustrates a perspective view of a semiconductor device 500, which may also be referred to as a multi-gate finFET device, since at least two separate channel regions may be controlled by respective portions of a gate electrode. In the manufacturing stage shown, the device 500 may comprise a substrate 501, such as a silicon substrate or any other appropriate carrier material, on which may be formed an appropriate base layer 502, which, in some illustrative embodiments, may represent an insulating layer, such as a silicon dioxide layer, a silicon nitride layer, a silicon oxynitride layer and the like. For example, if the substrate 501 may be comprised of a substantially crystalline semiconductor material, the base layer 502, if provided in the form of an insulating material, and the substrate 501 may define a silicon-on-insulator (SOI) configuration.

Moreover, a plurality of fins 510 are formed on the layer 502 and comprise respective end portions 510E and a central portion 510C, which is covered by a gate electrode structure 520. Furthermore, a gate insulation material may be formed at least on sidewalls of the fins 510 (not shown in FIG. 5), while a corresponding gate insulation layer may be formed on a top surface of the fins 510 if a tri-gate transistor architecture is considered. In other cases, the fins 510 may be covered by a cap layer (not shown) which may result in an insufficient capacitive coupling to the fins 510, so that the top surface thereof may effectively not act as a channel region. With respect to any material composition of the fins 510, it is to be appreciated that any appropriate material, such as silicon, silicon/germanium, germanium or any other appropriate semiconductor compound may be used, depending on the overall device requirements. Similarly, the corresponding dimensions of the fins 510 may be selected in accordance with the design rules of the corresponding technology node under consideration.

FIG. 6 illustrates a stylized depiction of a cross-sectional view taken along the section IIb of FIG. 5. As illustrated, a cap layer 512, such as a silicon oxide or High-K $HFO_2$ layer and the like, may be formed on the fins 510, and the gate electrode structure 520, which may be comprised of any appropriate material, such as polysilicon, a metal-containing material and the like, may be formed on the cap layer 512 and may also extend down to the layer 502 along the corresponding sidewalls of a Fin 510 (not shown in the section of FIG. 6). The semiconductor device 500 as shown in FIGS. 5 and 6 may be formed on the basis of wellestablished process techniques as are, for instance, also explained above with reference to the device 100.

Figure 7:
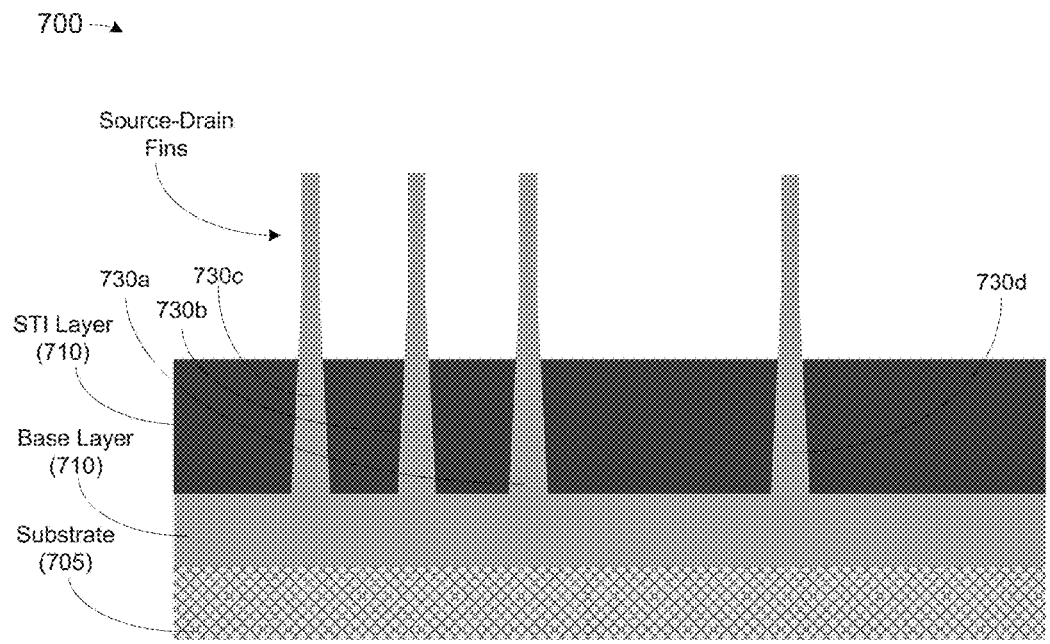
FIG. 7 illustrates a stylized cross-sectional view of a set of finFETs (device 700) under manufacture, in accordance with embodiments herein.
Figure 8:
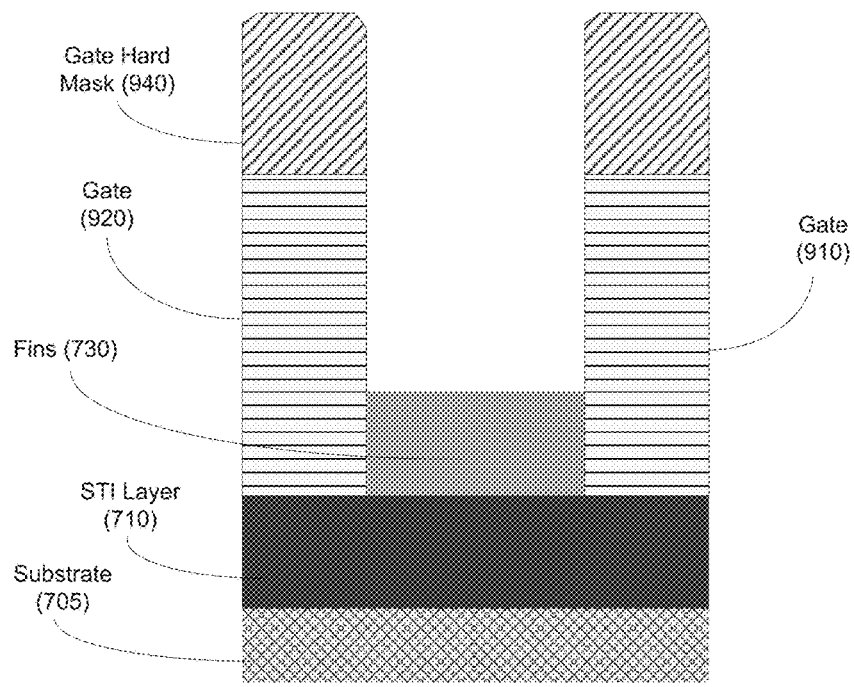
FIG. 8 illustrates a stylized cross-sectional 90 degree rotated view of the set of finFETs of FIG. 7, in accordance with embodiments herein.

FIG. 7-19 illustrate stylized cross-sectional depictions of finFET devices under various stage of manufacture, in accordance with embodiments herein. FIG. 7 illustrates a stylized cross-sectional view of a set of finFETs (device 700) under manufacture, and FIG. 8 illustrates a stylized cross-sectional 90 degree rotated view of the set of finFETs of FIG. 8, in accordance with embodiments herein. In some embodiments, the device 700 under manufacture may comprise a plurality of finFET devices are formed. Referring simultaneously to FIGS. 7 and 8, the device 700 comprises a substrate layer 705 (e.g., silicon substrate, silicon germanium substrate, etc.) on which a base layer 710 is formed. Using one of various techniques (such as the techniques described with respect to FIGS. 5-6), source-drain fins 730(a-d) are formed on the base layer 710. Fins 730a, 730b, and 730c are source-drains fins for a first device, while fin 730d is a source-drain fin for a second finFET device.

The source-drain fins 730 are be surrounded by gates 910 and 920 (FIG. 8), which in one embodiment, may be dummy gates. A gate hard mask 760 may be formed on the gates 910, 920. FIG. 8 also illustrates an STI layer 720 that is formed on the substrate 705.

On top of the base layer 710 (FIG. 7), an STI layer 720 may be formed. The portions of the fins 730 that rise above the STI layer 720 are exposed, and as such, EPI layers may be grown on those portions. When growing an EPI layer at the top of the fins 730, it is desirable to prevent shorts caused by over-growth of the EPI layers between fins of first and second finFETs. It is also desirable to prevent formation of a source-drain bridge that could result from over-growth of EPI layers, which could cause a short upon the end of a gate of the finFET devices. Accordingly, embodiments herein provide for mitigating the lateral growth of EPI layers on the outer walls of source-drain fins bordering one finFET device to another.

Figure 9:
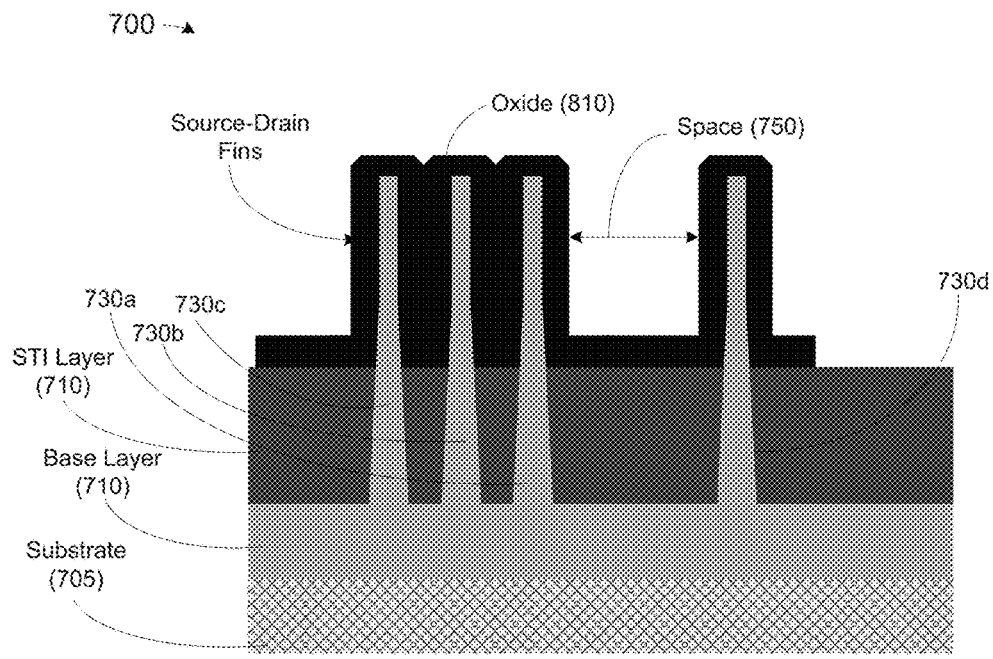
FIG. 9 illustrates a stylized cross-sectional view of a set of the finFETs undergoing an oxide deposition process, in accordance with embodiments herein.
Figure 10:
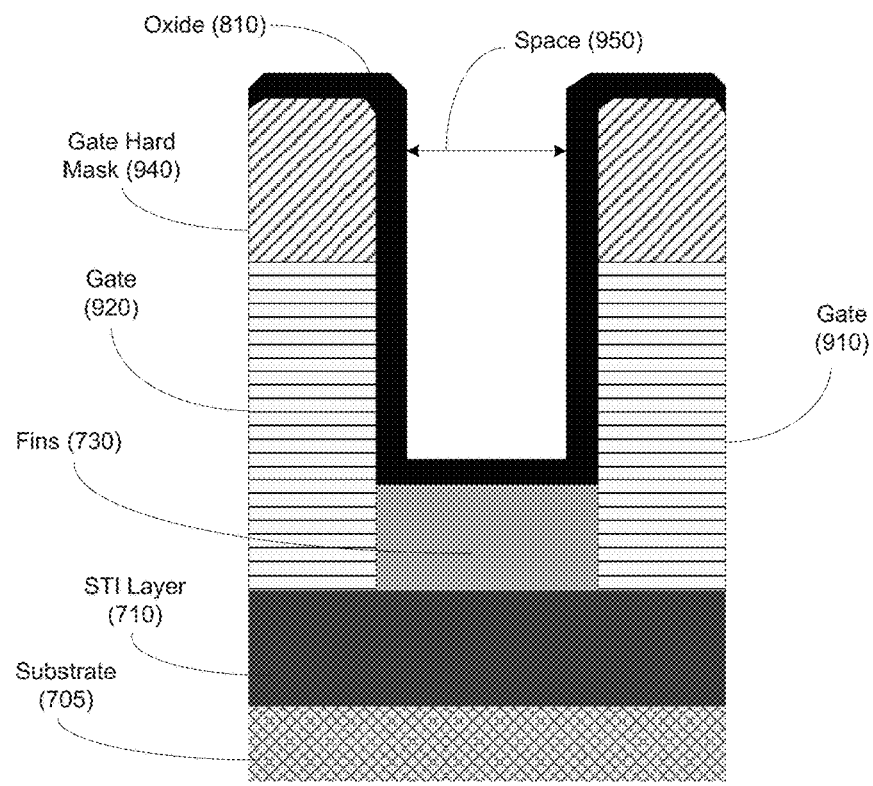
FIG. 10 illustrates a stylized cross-sectional 90 degree rotated view of the set of finFETs of FIG. 9, in accordance with embodiments herein.

Referring simultaneously to FIGS. 9 and 10, FIG. 9 illustrates a stylized cross-sectional view of a set of the finFETs undergoing an oxide deposition process. and FIG. 10 illustrates a stylized cross-sectional 90 degree rotated view of the set of finFETs of FIG. 9, in accordance with embodiments herein. An oxide deposition process is performed. This process comprises deposition of silicon oxide over the source-drain fins, including within spaces between the fins. The oxide material is deposited between the small spaces between fins 730a, 730b, 730c of the first device, as well as between larger spaces between the border/outer fins, e.g., between fin 730c of the first device and fin 730d of the second device.

The source-drain fins 730 are be surrounded by gates 910 and 920 (FIG. 9), which in one embodiment may be dummy gates. The oxide material 810 deposited above the fins 730 and gates 910, 920 may be thick enough to leave a space 930 between the gates 910, 920 (as shown in FIG. 10), but viscous enough to fill the space between the fins 730(a-c) of the first device (as shown in FIG. 9). Moreover, as shown in FIG. 8, after depositing the oxide layer 810, a space 750 is left between fins of the first device and fins of the second device.

Figure 11:
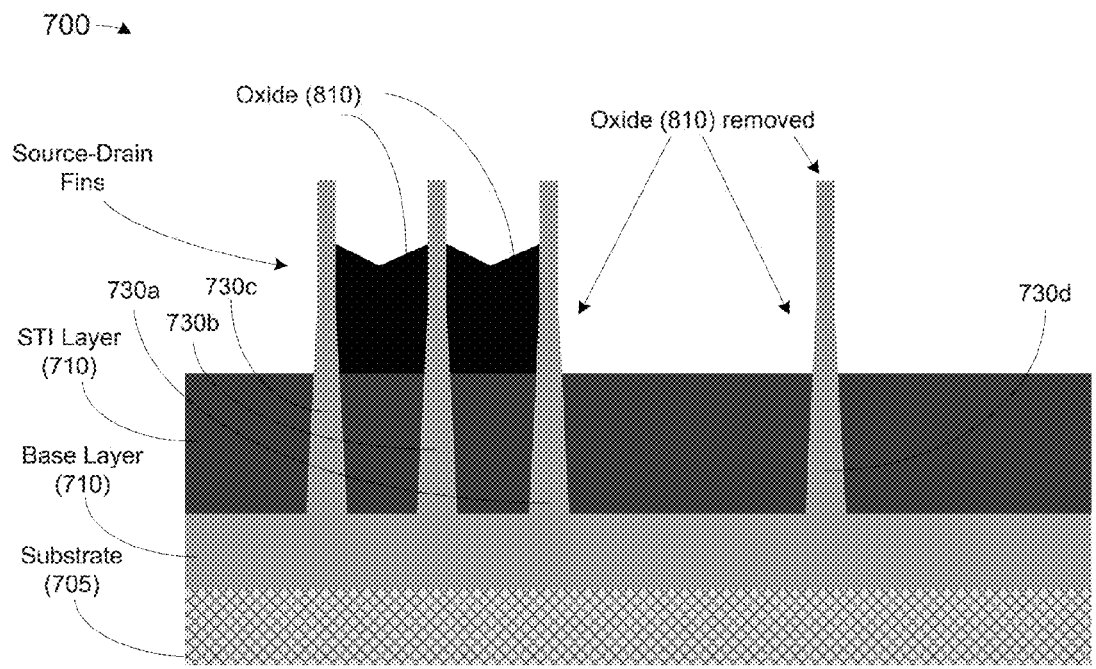
FIG. 11 illustrates a stylized cross-sectional view of a set of the finFETs undergoing an oxide removal process, in accordance with embodiments herein.
Figure 12:
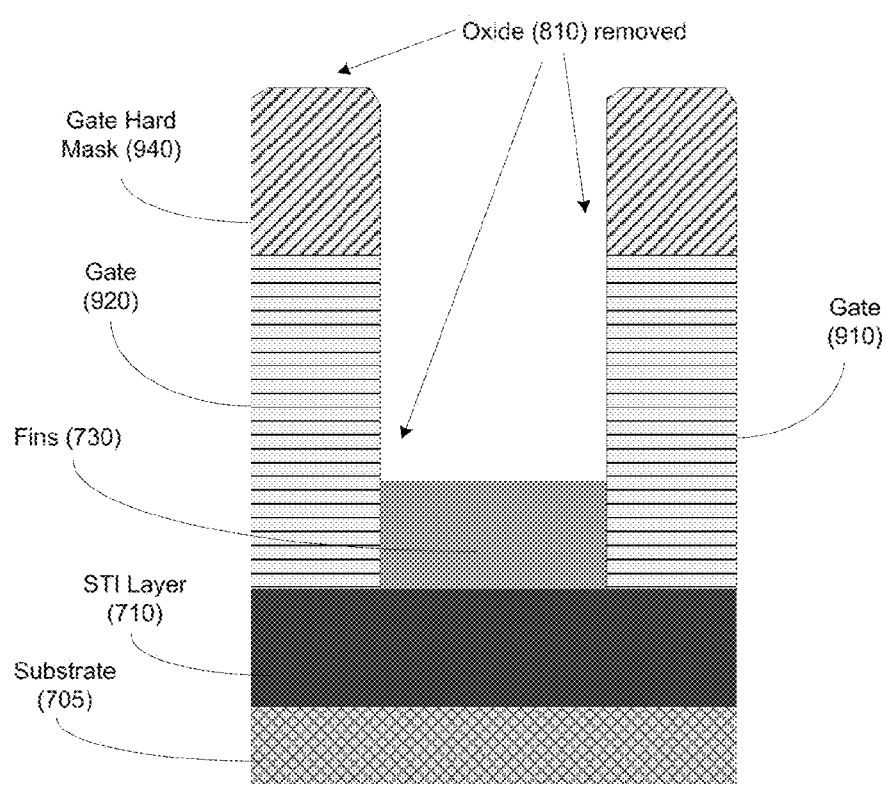
FIG. 12 illustrates a stylized cross-sectional 90 degree rotated view of the set of finFETs of FIG. 11, in accordance with embodiments herein.

Referring simultaneously to FIGS. 11 and 12, FIG. 11 illustrates a stylized cross-sectional view of a set of the finFETs undergoing an oxide removal process, and FIG. 12 illustrates a stylized cross-sectional 90 degree rotated view of the set of finFETs of FIG. 10, in accordance with embodiments herein. A recess process is performed to substantially remove the oxide material 810 (e.g., silicon oxide).

The recess process may comprise implementing a wet etch process, a SiCoNi etch process, or a combination of both. As shown in FIGS. 11 and 12, the recess process removes the oxide material 810 between the gates 910, 920, as well as between the border fins (fins 730a and 730c) of the first device and the border fin (fin 730d) of the second device. As shown in FIG. 11, after this recess process, oxide material 810 remains between the fins 730(a-c) of a finFET device.

Figure 13:
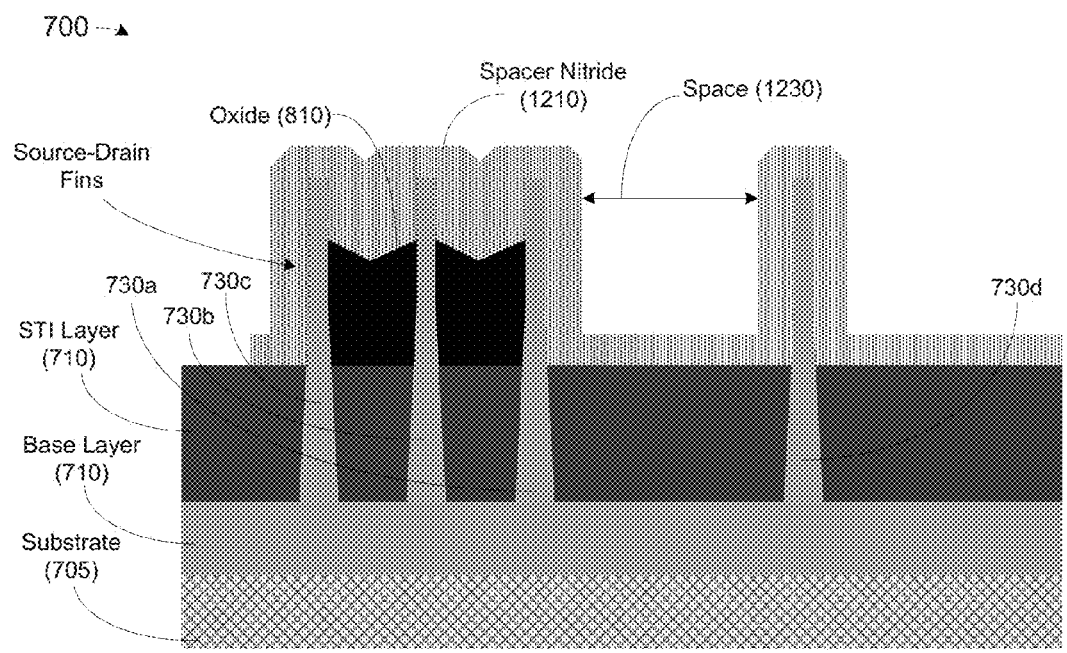
FIG. 13 illustrates a stylized cross-sectional view of a set of the finFETs undergoing an nitride deposition process, in accordance with embodiments herein.
Figure 14:
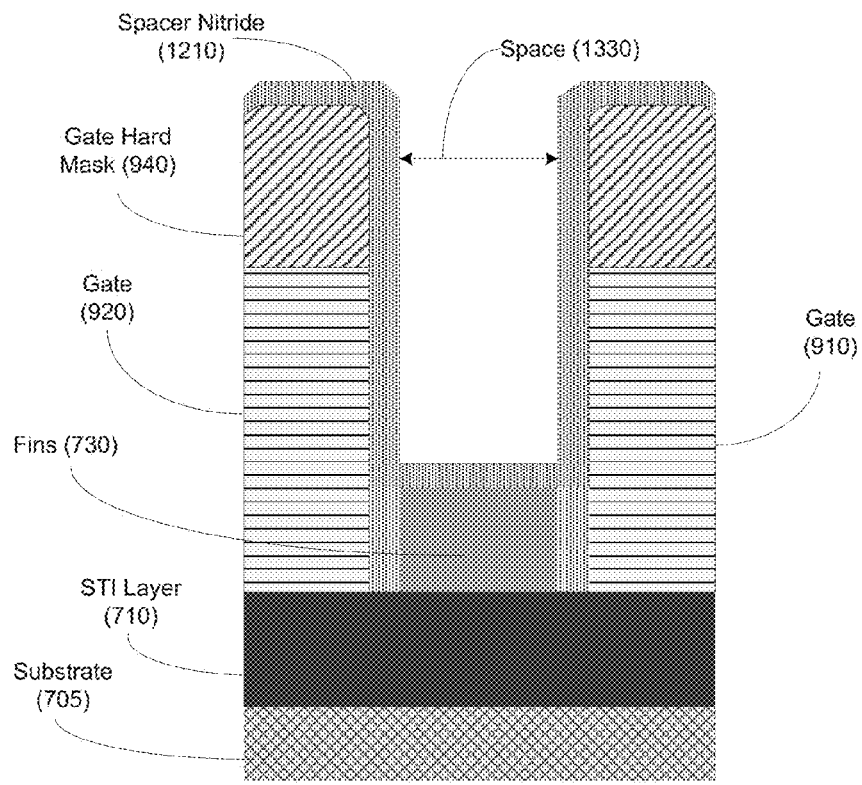
FIG. 14 illustrates a stylized cross-sectional 90 degree rotated view of the set of finFETs of FIG. 13, in accordance with embodiments herein.

Referring simultaneously to FIGS. 13 and 14, FIG. 13 illustrates a stylized cross-sectional view of a set of the finFETs undergoing a nitride deposition process, and FIG. 14 illustrates a stylized cross-sectional 90 degree rotated view of the set of finFETs of FIG. 13, in accordance with embodiments herein. A spacer nitride deposition process is performed on the devices 700. The spacer nitride material 1210 (e.g., silicon nitride) deposited above the fins 730 and gates 910, 920 may be thick enough to leave a space 1330 between the gates 910, 920 (as shown in FIG. 14), but viscous enough to fill the space between the fins 730(a-c) of the first device (as shown in FIG. 13). Moreover, as shown in FIG. 12, after depositing spacer nitride 1210, a space 1230 is left between fins of the first device and fins of the second device.

In one embodiment, the order of processes provided herein call for performing the oxide recess process prior to performing the spacer nitride deposition process. Since the oxide recess process is performed first, the remaining oxide between the fins 730a-c prevent the spacer nitride material 1210 from being deposited into the inner walls of the fins 730a-c. Therefore, EPI deposition/growth can take place between the inner walls for the fins 730a-c.

Figure 15:
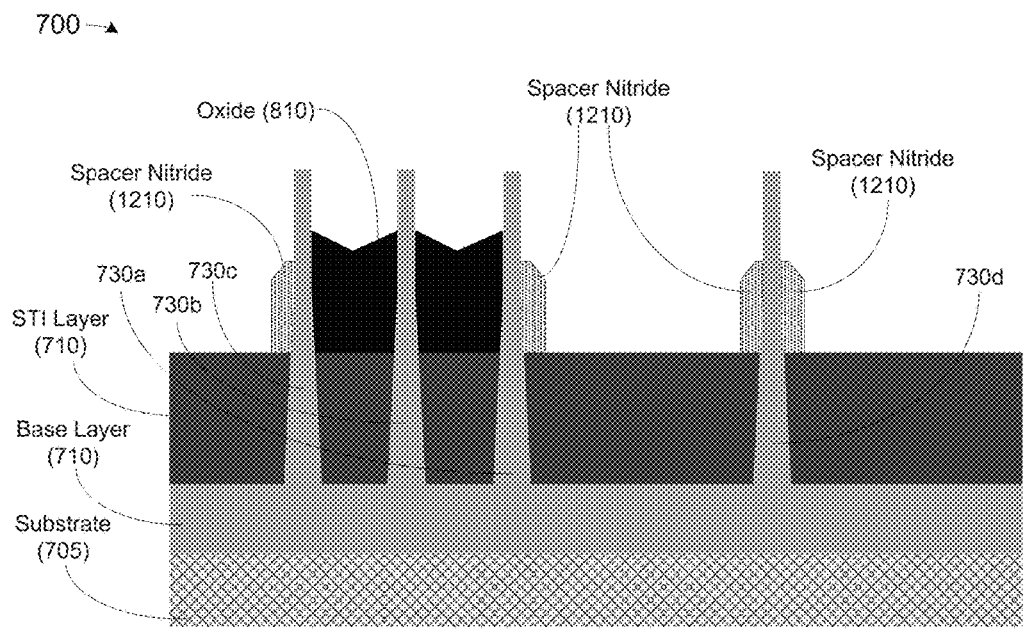
FIG. 15 illustrates a stylized cross-sectional view of a set of the finFETs undergoing an spacer nitride removal, in accordance with embodiments herein.
Figure 16:
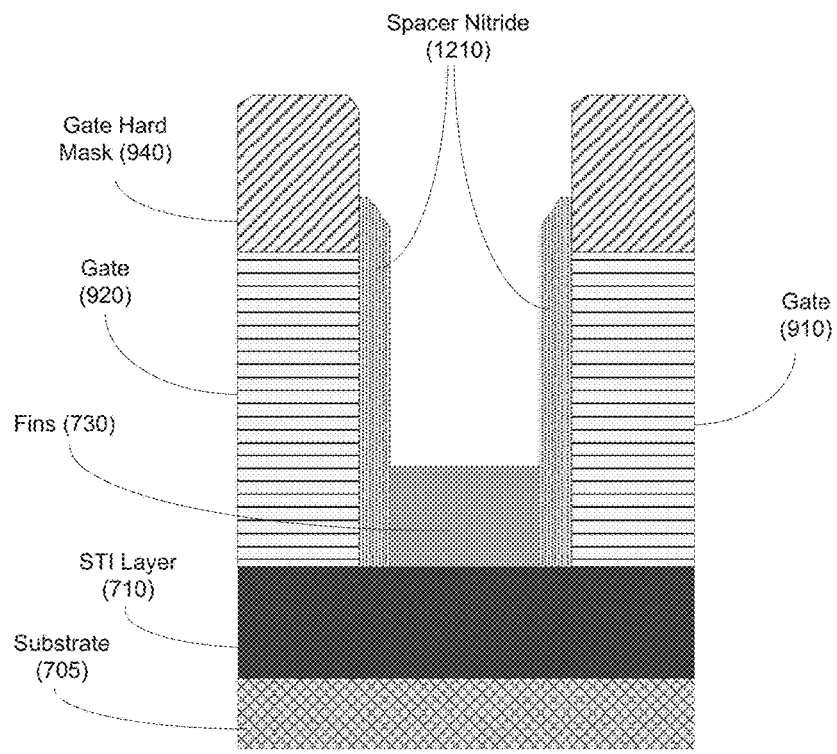
FIG. 16 illustrates a stylized cross-sectional 90 degree rotated view of the set of finFETs of FIG. 15, in accordance with embodiments herein.

Referring simultaneously to FIGS. 15 and 16, FIG. 15 illustrates a stylized cross-sectional view of a set of the finFETs undergoing a spacer nitride removal process, and FIG. 16 illustrates a stylized cross-sectional 90 degree rotated view of the set of finFETs of FIG. 15, in accordance with embodiments herein. A spacer nitride removal (e.g., spacer etch process) may be performed for substantially removing the spacer nitride between the fins. This process removes the nitride spacer material 1210 from between the inner walls of the fins 730a-c of the first device, as shown in FIG. 14. As shown in FIG. 16, the nitride spacer material 1210 remains in the side walls for the gates 910, 920.

Figure 17:
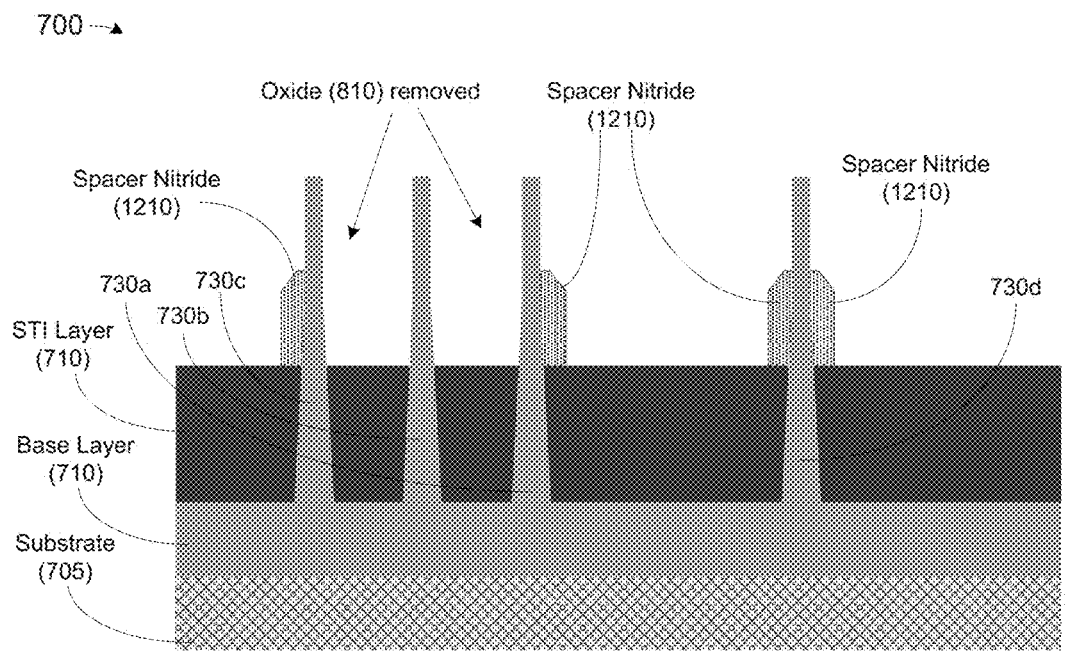
FIG. 17 illustrates a stylized cross-sectional view of a set of the finFETs undergoing an EPI fill oxide recess process, in accordance with embodiments herein.
Figure 18:
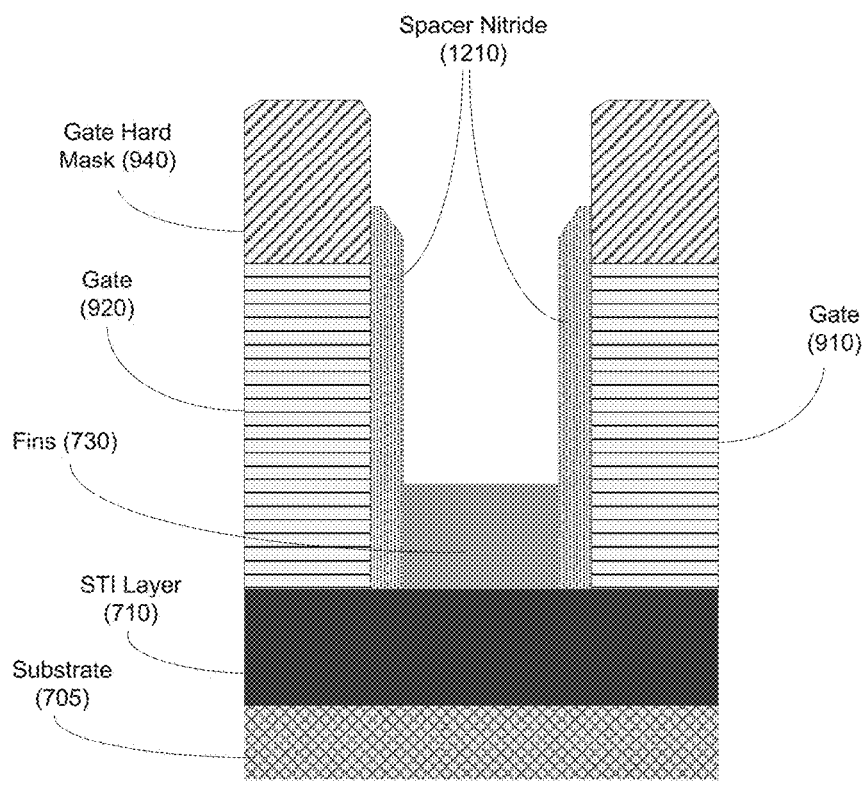
FIG. 18 illustrates a stylized cross-sectional 90 degree rotated view of the set of finFETs of FIG. 17, in accordance with embodiments herein.

Further, the nitride spacer material 1210 remains on the outside walls of the outer fins 730a, 730c of the first device as wells as the fin 730d of the second device. The remaining nitride space materials 1210 adjacent to the fins 730a, 730c and 730d are capable of suppressing the lateral growth and/or downward vertical growth of EPI layers grown on the outer portions fins 730a, 730c, 730d. This suppression may be achieved while not suppressing vertical growth of the EPI layers on the outer portions, and not suppressing any EIP growth on the inner portions of the fins 730a and 730c Referring simultaneously to FIGS. 17 and 18, FIG. 17 illustrates a stylized cross-sectional view of a set of the finFETs undergoing an EPI fill oxide recess process, and FIG. 18 illustrates a stylized cross-sectional 90 degree rotated view of the set of finFETs of FIG. 17, in accordance with embodiments herein. In one embodiment, a wet etch, a dry etch, or a combination thereof may be performed to remove the remaining silicon oxide between the fins 730.

The EPI fill oxide recess process is performed for removing oxide in a manner that an EPI layer may be deposited into the regions from which oxide was removed. As shown in FIG. 17, EPI fill oxide recess process removes oxide material from between the dense fins 730(a-c), leaving only the space nitride portions on the outer walls for the outer fins 730a, 730c. This process leaves the exposed part of the fins 730 (i.e., the portion of the fins above the STI layer 720) substantially bare except for the silicon nitride remaining on the outer walls of the outer fins 730a, 730c of each finFET. As such EPI layer may be formed on the fins 730 in the suppressed manner described herein.

FIG. 18 illustrates that the spacer nitride between the fins 730 and the gates 910, 920 remain after the EPI fill oxide recess process. In this manner, EPI growth/deposition on the fins 730 is controlled such that the EPI formations do not cause shorts between the EPI layers and the gates, or between the EPI layer of the fins 730a-c of a first device and the fin 730d of a second device.

Figure 19:
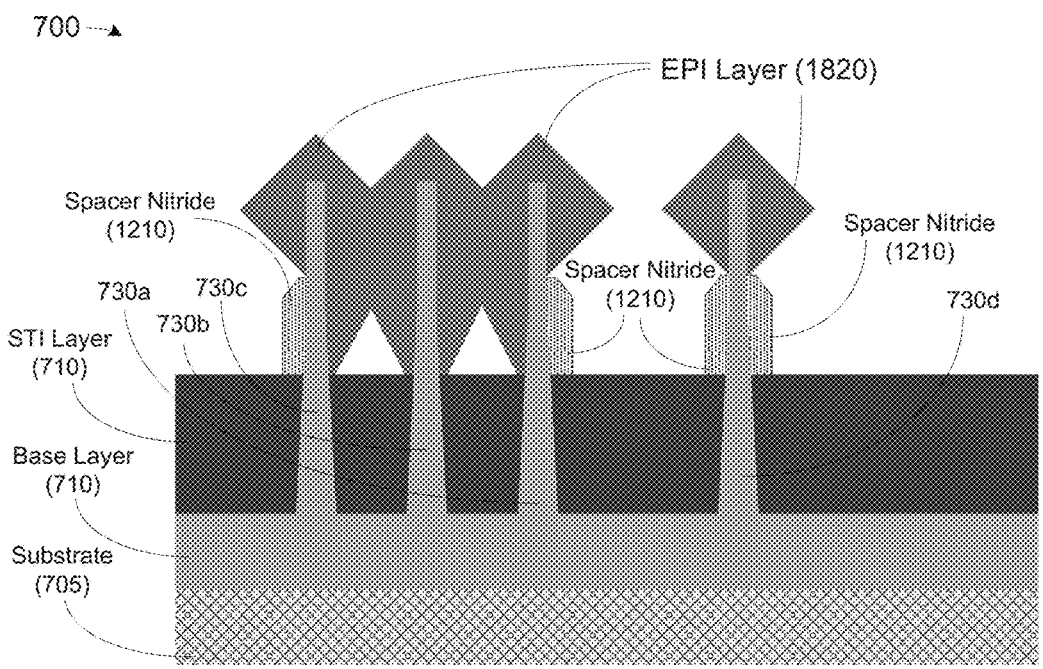
FIG. 19 illustrates a stylized cross-sectional view of a set of the finFETs undergoing an EPI deposition process, in accordance with embodiments herein.
Figure 20:
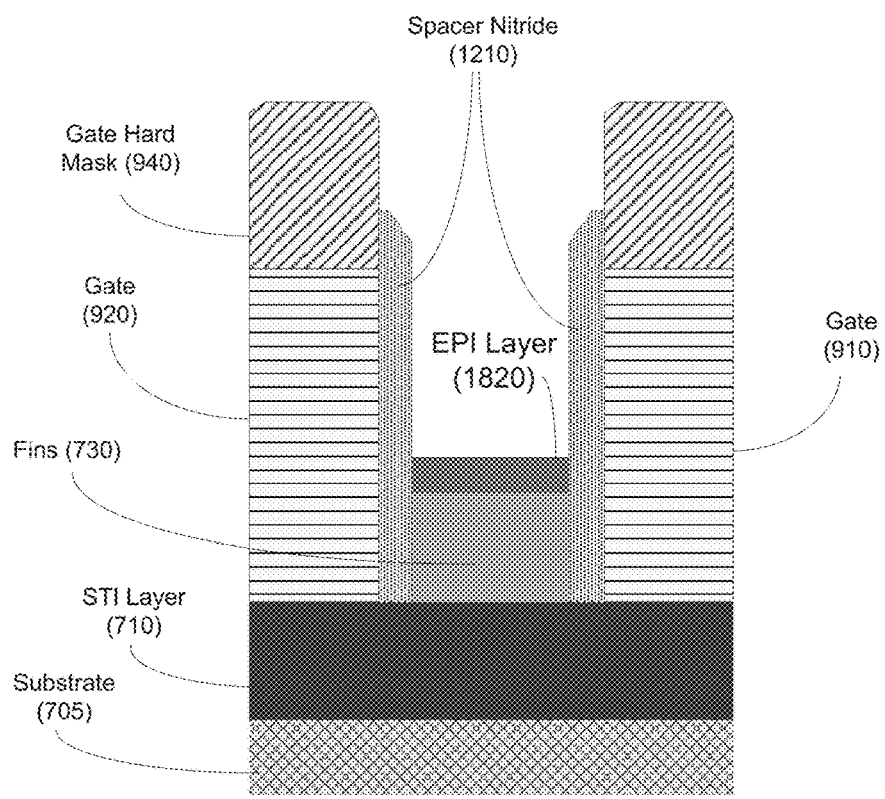
FIG. 20 illustrates a stylized cross-sectional 90 degree rotated view of the set of finFETs of FIG. 19, in accordance with embodiments herein.

Referring simultaneously to FIGS. 19 and 20, FIG. 19 illustrates a stylized cross-sectional view of a set of the finFETs undergoing an EPI deposition process, and FIG. 20 illustrates a stylized cross-sectional 90 degree rotated view of the set of finFETs of FIG. 19, in accordance with embodiments herein. At the top portions of the source-drains fins 730, i.e., the exposed portions of the fins 730 above the STI layer 720, EPI depositions/growth may be performed. As shown in FIG. 19, EPI layers 1820 are formed on the fins 720.

In some embodiments, the EPI layers 1820 may be grown to a size of about 5 nm to about 20 nm (lateral EPI width). The EPI layers 1820 may be deposited using a chemical vapor deposition process (CVD), e.g., reduced pressure CVD (RPCVD), ultra-high vacuum CVD (UHVCVD), metal organic CVD (MOCVD), etc. The precursors for the EPI layers 1820 may comprise gases comprising silicon (e.g., $SiH_4$, $Si_2H_4Cl_2$, $Si_2H_6$, $Si_3H_8$) and/or gases comprising germanium (e.g., $GeH_4$). The partial pressures of these gases may be adjusted to adjust the atomic ratio of germanium to silicon. In one embodiment, the EPI layers may be grown at 700° C., and may be decreased to 550° C. with source gas.

The deposition of the EPI layers 1820 may be performed as a plurality of deposition-etch cycles to provide epitaxial layers that are more conformal. As illustrated in FIG. 18, generally, the shape of the EPI layers 1820 upon deposition may be generally a diamond shape immediately after EPI growth. As would be appreciated by those skilled in the art having benefit of the present disclosure, further processing of the device 700 may cause the shape of the EPI formation to change from the diamond shape to a more rounded shape.

In one embodiment, the dimensions of the EIP layers (e.g., the width) may be controlled in such a manner that they are proportional to respective widths of the fins 730. The over-growth of EPI layers 1820 is curtailed by the presence of the spacer nitride material 1210. Therefore, the lateral growth and the downward vertical growth of the EPI layer on the out fins (730a, 730c) and the fin 730d may be curtailed by the presence of the nitride material 1210. Moreover, the EPI growths at the inner portions of the outer fins 730a, 730c and around the inner fin 730b are not suppressed and thus, free to grow in the lateral and the vertical dimensions.

As indicated in FIG. 20, the growth of the EPI layers 1820 is restricted to the regions above the fins 720 and away from the gates 910, 920 as a result of the presence of the space nitride material 1210. Further, as shown in FIG. 18, the later growth of the EPI layers 1820 are suppressed by the presence of the spacer nitride material 1210 at the outside walls of the outer fins 730a, 730c of the first device and the walls of the fin 730d of the second device. In this manner, sufficient EPI growth takes place in the vertical and lateral directions around the fins 730(a-c), while growth in the lateral and downward directions on the outer walls of the fins 730a, 730c, and 730d are restricted by the presence of the spacer nitride material 1210. Therefore, the probability of shorts developing between fins of different devices and/or gates are substantially reduced by embodiments herein.

Subsequent processing known to those skilled in the art having benefit of the present disclosure may be performed to form a complete finFET device (e.g., patterning, lithography, etch, metal gate, etc.). Such subsequent processing steps may be used to form finFET devices that comprise source-drain fins that comprise EPI growth with lateral over-growth of the EPI being substantially curtailed on the outer walls of the fins.

Figure 21:
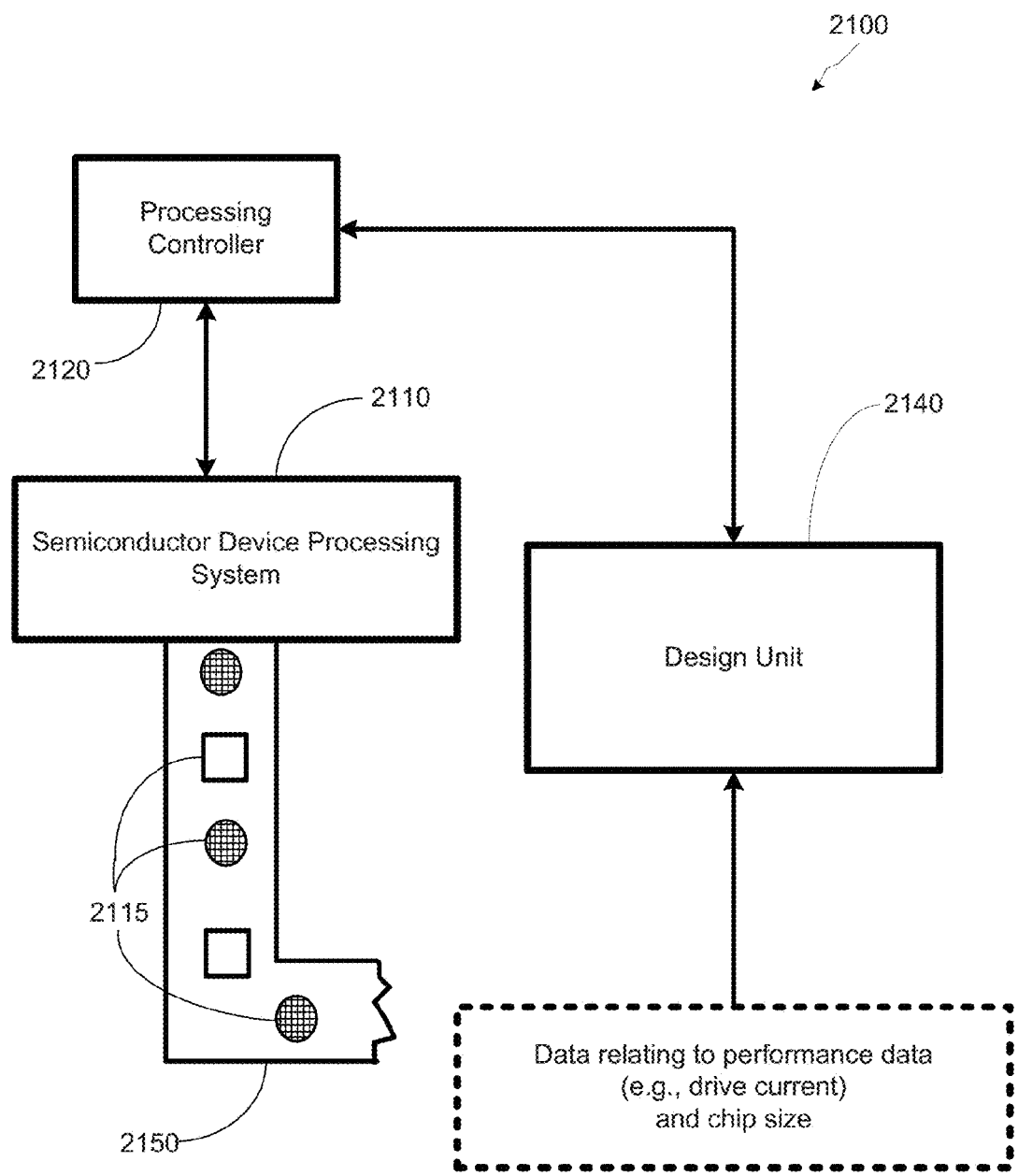
FIG. 21 illustrates a stylized depiction of a system for fabricating a semiconductor device package comprising finFET devices, in accordance with embodiments herein.

Turning now to FIG. 21, a stylized depiction of a system for fabricating a semiconductor device package comprising a topside interconnection substrate, in accordance with embodiments herein, is illustrated. The system 2100 of FIG. 21 may comprise a semiconductor device processing system 2110 and a design unit 2140. The semiconductor device processing system 2110 may manufacture integrated circuit devices based upon one or more designs provided by the design unit 2140.

The semiconductor device processing system 2110 may comprise various processing stations, such as etch process stations, photolithography process stations, CMP process stations, etc. One or more of the processing steps performed by the processing system 2110 may be controlled by the processing controller 2120. The processing controller 2120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2110 may produce integrated circuits on a medium, such as silicon wafers. More particularly, the semiconductor device processing system 2110 produce integrated circuits having finFET devices that source-drain fins that comprise EPI growth with lateral over-growth of the EPI being substantially curtailed on the outer walls of the fins, as described above.

The production of integrated circuits by the device processing system 2110 may be based upon the circuit designs provided by the integrated circuits design unit 2140. The processing system 2110 may provide processed integrated circuits/devices 2115 on a transport mechanism 2150, such as a conveyor system. In some embodiments, the conveyor system may be sophisticated clean room transport systems that are capable of transporting semiconductor wafers. In one embodiment, the semiconductor device processing system 2110 may comprise a plurality of processing steps, e.g., the $1^{st}$ process step, the $2^{nd}$ process set, etc., as described above.

In some embodiments, the items labeled "2115" may represent individual wafers, and in other embodiments, the items 2115 may represent a group of semiconductor wafers, e.g., a "lot" of semiconductor wafers. The integrated circuit or device 2115 may be a transistor, a capacitor, a resistor, a memory cell, a processor, and/or the like. In one embodiment, the device 2115 is a transistor and the dielectric layer is a gate insulation layer for the transistor.

The integrated circuit design unit 2140 of the system 2100 is capable of providing a circuit design that may be manufactured by the semiconductor processing system 2110. The integrated circuit design unit 2140 may be capable of determining the number of devices (e.g., processors, memory devices, etc.) to place in a device package. The integrated circuit design unit 2140 may also determine the height of the gate fins, the dimensions of EPI growth on fins of the finFET devices, etc. These dimensions may be based upon data relating to drive currents/performance metrics, device dimensions, etc. Based upon such details of the devices, the integrated circuit design unit 2140 may determine specifications of the finFETs that are to be manufactured. Based upon these specifications, the integrated circuit design unit 2140 may provide data for manufacturing a semiconductor device package described herein.

The system 2100 may be capable of performing analysis and manufacturing of various products involving various technologies. For example, the system 2100 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A system, comprising:
    a semiconductor device processing system to manufacture a semiconductor device comprising at least one fin field effect transistor (finFET); and
    a processing controller operatively coupled to said semiconductor device processing system, said processing controller configured to control an operation of said semiconductor device processing system;
    wherein said semiconductor device processing system is adapted to:
    form a set of fins of a first transistor, said set of fins comprising a first outer fin, an inner fin, and a second outer fin;
    perform an oxide deposition process for depositing an oxide material upon set of fins and within spaces between said fins;
    perform a first recess process for removing a portion of oxide material, leaving a portion of the oxide material on the inside walls of said first and second outer fins;
    perform a spacer nitride deposition process for depositing a spacer nitride material upon said set of fins and on outer walls of the first and second outer fins;
    perform a spacer nitride removal process, leaving spacer nitride material on a first portion of the outer walls of the first and second outer fins;
    perform a second recess process for removing said oxide material from the inside walls of said first and second outer fins; and
    perform an epitaxial layer deposition process upon said set of fins, wherein any lateral over-growth of epitaxial layer on said outer walls of said first and second outer fins is suppressed by said spacer nitride material at the first portion, and wherein lateral overgrowth of the epitaxial layer occurs on a second portion of the outer walls of said first and second outer fins.

2. The system of claim 1, further comprising a design unit configured to generate a first design comprising a definition for a process mask and a definition for an operation of a FinFET device that comprises a plurality of fins, wherein data from said design unit is used by said process controller to control an operation of said semiconductor device processing system.

3. The system of claim 1, wherein the width of said epitaxial layer is based upon said width of said fin, wherein said width of said epitaxial layer is proportional to said width of said fin.

4. The system of claim 1, wherein said semiconductor device processing system is further adapted to perform an epitaxial layer deposition process upon a third outer fin of a second transistor adjacent to said first transistor, wherein performing an epitaxial layer deposition process upon said set of fins comprises suppressing said lateral over-growth of the epitaxial layer on said first portion such that the epitaxial layer on said first outer fin does not touch said epitaxial layer deposited on said third outer fin.

5. The system of claim 1, wherein said semiconductor device processing system is further adapted to deposit silicon dioxide of a consistency to deposit said silicon dioxide between the inside walls of said first and second outer fins.

6. The system of claim 1, wherein at least a portion of vertical over-growth of the epitaxial layers on said outer walls of said first and second outer fins is suppressed by said spacer nitride material.

* * * * *